(12) United States Patent
Takeda

(10) Patent No.: US 12,492,476 B2
(45) Date of Patent: *Dec. 9, 2025

(54) SUBSTRATE PROCESSING APPARATUS, METHOD OF PROCESSING SUBSTRATE, METHOD OF MANUFACTURING SEMICONDUCTOR DEVICE, AND PLASMA GENERATION DEVICE PRELIMINARY

(71) Applicant: KOKUSAI ELECTRIC CORPORATION, Tokyo (JP)

(72) Inventor: Tsuyoshi Takeda, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/185,596

(22) Filed: Mar. 17, 2023

(65) Prior Publication Data
US 2023/0220552 A1    Jul. 13, 2023

Related U.S. Application Data

(63) Continuation of application No. 16/783,913, filed on Feb. 6, 2020, now Pat. No. 11,629,408, which is a
(Continued)

(30) Foreign Application Priority Data

Aug. 14, 2017    (JP) .................................. 2017-156343

(51) Int. Cl.
*H01L 21/67*    (2006.01)
*C23C 16/505*    (2006.01)
*H05H 1/46*    (2006.01)

(52) U.S. Cl.
CPC ...... *C23C 16/505* (2013.01); *H01L 21/67017* (2013.01); *H01L 21/67242* (2013.01); *H05H 1/46* (2013.01); *H05H 2242/26* (2021.05)

(58) Field of Classification Search
CPC ............ C23C 16/505; C23C 16/45534; C23C 16/45542; C23C 16/45546; C23C 16/345;
(Continued)

(56) References Cited

U.S. PATENT DOCUMENTS 4,935,596 A * 6/1990 Gagne .................. B23K 10/006
219/130.21
8,257,789 B2 * 9/2012 Matsunaga ........... C23C 16/455
118/729
(Continued)

FOREIGN PATENT DOCUMENTS

CN    102299045 A    12/2011
CN    103035485 A    4/2013
(Continued)

OTHER PUBLICATIONS

Chinese Office Action issued on Aug. 25, 2021 for Chinese Patent Application No. 201880049896.9.
(Continued)

*Primary Examiner* — Mohammed Shamsuzzaman
(74) *Attorney, Agent, or Firm* — Volpe Koenig

(57) ABSTRACT

There is provided a technique that includes: high-frequency power sources supplying power to plasma generators; and matchers installed between the high-frequency power sources and the plasma generators and matching load impedances of the plasma generators with output impedances of the high-frequency power sources, wherein at least one of the high-frequency power sources includes: a high-frequency oscillator; a directional coupler at a subsequent stage of the high-frequency oscillator, which extracts a part of a traveling wave component from the high-frequency oscillator and a part of a reflected wave component from the matcher; a filter removing a noise signal in the reflected wave component extracted by the directional coupler; and a power monitor measuring the reflected wave component
(Continued)

after passing through the filter and the traveling wave component extracted by the directional coupler and feedback-controlling the matcher to reduce a ratio between the reflected wave component and the traveling wave component.

16 Claims, 12 Drawing Sheets

Related U.S. Application Data continuation of application No. PCT/JP2018/006183, filed on Feb. 21, 2018.

(58) Field of Classification Search
CPC ......... H01L 21/67017; H01L 21/67242; H01L 21/677; H05H 1/46; H05H 2242/26; H01J 37/32183; H01J 37/32733; H01J 37/32935
See application file for complete search history.

(56) References Cited

U.S. PATENT DOCUMENTS

| | | | | |
|---|---|---|---|---|
| 9,807,863 | B1* | 10/2017 | Van Zyl | ............ H05H 1/46 |
| 2004/0212400 | A1* | 10/2004 | Watanabe | ............ G01R 21/00 |
| | | | | 327/47 |
| 2006/0081624 | A1* | 4/2006 | Takada | ............ H01J 37/32192 |
| | | | | 219/716 |
| 2010/0149326 | A1 | 6/2010 | Shin et al. | |
| 2010/0194195 | A1* | 8/2010 | Coumou | ............ H01J 37/32174 |
| | | | | 307/24 |
| 2011/0129619 | A1* | 6/2011 | Matsunaga | ............ C23C 16/52 |
| | | | | 427/248.1 |
| 2011/0315320 | A1 | 12/2011 | Do et al. | |
| 2013/0084712 | A1* | 4/2013 | Yuasa | ............ C23C 16/402 |
| | | | | 257/E21.267 |
| 2014/0225504 | A1* | 8/2014 | Kaneko | ............ H05H 1/46 |
| | | | | 118/712 |
| 2015/0319838 | A1* | 11/2015 | Bhutta | ............ H04B 10/40 |
| | | | | 315/111.21 |
| 2019/0198331 | A1* | 6/2019 | Sasaki | ............ H01L 21/0234 |
| 2020/0173027 | A1* | 6/2020 | Takeda | ............ C23C 16/45542 |

FOREIGN PATENT DOCUMENTS

| | | | | |
|---|---|---|---|---|
| CN | 110959312 | A * | 4/2020 | ............ C23C 16/345 |
| JP | 2003-344465 | A | 12/2003 | |
| JP | 2007231424 | A * | 9/2007 | |
| JP | 2014142266 | A * | 8/2014 | ........ H01J 37/32082 |
| JP | 2014175509 | A | 9/2014 | |
| KR | 1020040048999 | A | 6/2004 | |
| KR | 1020060051930 | A | 5/2006 | |
| KR | 10-0860473 | B1 | 9/2008 | |
| KR | 1020100090213 | A | 8/2010 | |
| KR | 1020130110104 | A | 10/2013 | |
| WO | WO-2019035223 | A1 * | 2/2019 | ............ C23C 16/345 |

OTHER PUBLICATIONS

Japanese Office Action issued on Apr. 20, 2021 for Japanese Patent Application No. 2020-092013.
Korean Office Action issued on Jun. 4, 2020 for Korean Patent Application No. 10-2019-7024462.

\* cited by examiner

SUBSTRATE PROCESSING APPARATUS, METHOD OF PROCESSING SUBSTRATE, METHOD OF MANUFACTURING SEMICONDUCTOR DEVICE, AND PLASMA GENERATION DEVICE PRELIMINARY

RELATED APPLICATIONS

This application is a Continuation Application of U.S. patent application Ser. No. 16/783,913, filed Feb. 6, 2020, which is a National Phase entry according to 35 U.S.C. 371 of International Application No. PCT/JP2018/006183, filed on Feb. 21, 2018, which claims priority to Japanese Patent Application No. 2017-156343, filed on Aug. 14, 2017, in the Japanese Patent Office, the entire contents of which are hereby incorporated by reference.

TECHNICAL FIELD

The present disclosure relates to a plasma generation device, a substrate processing apparatus, and a method of manufacturing a semiconductor device.

BACKGROUND OF INVENTION

As an example of a process of manufacturing a semiconductor device, substrate processing of forming various films such as an insulating film, a semiconductor film, a conductor film, and the like on a substrate or removing various films is often carried out by loading the substrate into a process chamber of a substrate processing apparatus and activating a process gas such as a precursor gas, a reaction gas, or the like, which is supplied into the process chamber, by using plasma. The plasma is used for promoting the reaction of a deposited thin film, removing an impurity from the thin film, or assisting the chemical reaction of a film-forming precursor.

However, in a processing apparatus that generates plasma using a plurality of high-frequency power sources, since the differences in frequencies of the respective high-frequency power sources interfere with each other to generate noise, stable plasma generation may not be performed.

SUMMARY OF THE INVENTION

The present disclosure provides some embodiments of a technique capable of performing stable plasma generation even when plasma generation is performed using a plurality of high-frequency power sources.

According to one or more embodiments of the present disclosure, there is provided a technique that includes processing a substrate using a plurality of plasma generators, including a plurality of high-frequency power sources configured to supply power to a plurality of plasma generators, respectively; and a plurality of matchers installed between the plurality of high-frequency power sources and the plurality of plasma generators, and configured to respectively match load impedances of the plasma generators with output impedances of the high-frequency power sources, wherein at least one high-frequency power source of the plurality of high-frequency power sources includes: a high-frequency oscillator configured to oscillate a high-frequency; a directional coupler disposed at a subsequent stage of the high-frequency oscillator, and configured to extract a part of a traveling wave component from the high-frequency oscillator and a part of a reflected wave component from a corresponding matcher of the plurality of matchers; a filter configured to remove a noise signal included in the reflected wave component extracted by the directional coupler; and a power monitor configured to: measure the reflected wave component after passing through the filter and the traveling wave component extracted by the directional coupler; and feedback-control the corresponding matcher to reduce a ratio between the reflected wave component and the traveling wave component measured by the power monitor.

DETAILED DESCRIPTION

<One or More Embodiments of the Present Disclosure>

A substrate processing apparatus according to the embodiments of the present disclosure will now be described with reference to FIGS. 1 to 10.

(1) Configuration of Substrate Processing Apparatus (Heating Device)

Figure 1:
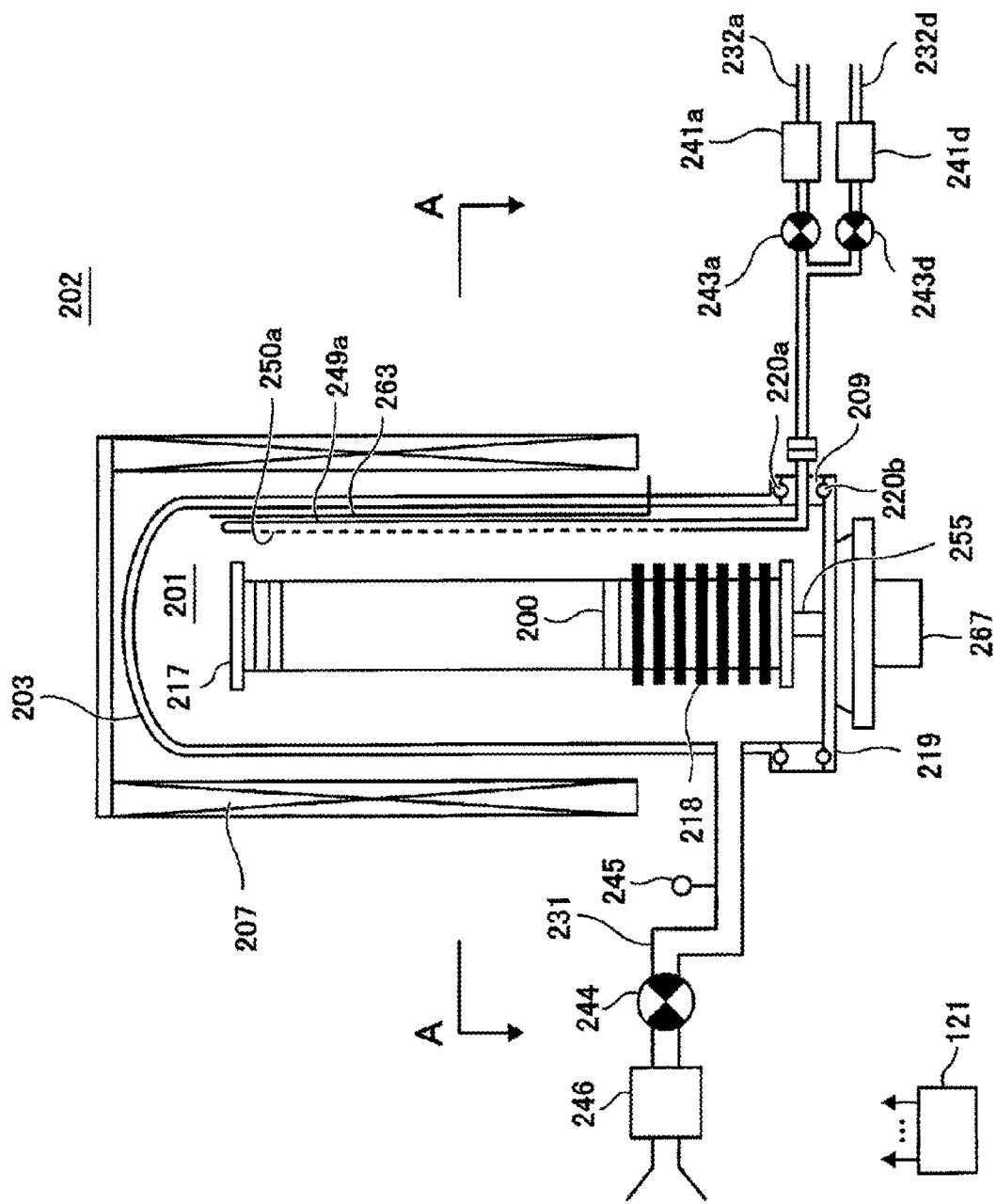
FIG. 1 is a schematic configuration diagram of a vertical type process furnace of a substrate processing apparatus suitably used in the embodiments of the present disclosure, in which a portion of the process furnace is shown in a vertical cross sectional view.

As illustrated in FIG. 1, a substrate processing apparatus according to some embodiments of the present disclosure includes a process furnace 202. The process furnace 202 is a so-called vertical type furnace configured to accommodate substrates in multiple stages along a vertical direction, and includes a heater 207 as a heating device (heating mechanism). The heater 207 has a cylindrical shape and is supported by a heater base (not shown) as a holding plate so as to be vertically installed. As will be described hereinbelow, the heater 207 functions as an activation mechanism (an exciter) configured to thermally activate (excite) a gas.

(Process Chamber)

A reaction tube 203 is disposed inside the heater 207 to be concentric with the heater 207. The reaction tube 203 is made of a heat resistant material, e.g., quartz ($SiO_2$), silicon carbide (SiC), or the like, and has a cylindrical shape with its upper end closed and its lower end opened. A manifold (inlet flange) 209 is disposed below the reaction tube 203 to be concentric with the reaction tube 203. The manifold 209 is made of metal, e.g., stainless steel (SUS) or the like, and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. As the manifold 209 is supported by the heater base, the reaction tube 203 comes into a vertically installed state. A process container (reaction vessel) mainly includes the reaction tube 203 and the manifold 209. A process chamber 201 is formed in a hollow cylindrical portion of the process container. The process chamber 201 is configured to be able to accommodate a plurality of wafers 200 as substrates. The process container is not limited to the aforementioned configuration, and only the reaction tube 203 may be referred to as the process container.

Figure 2:
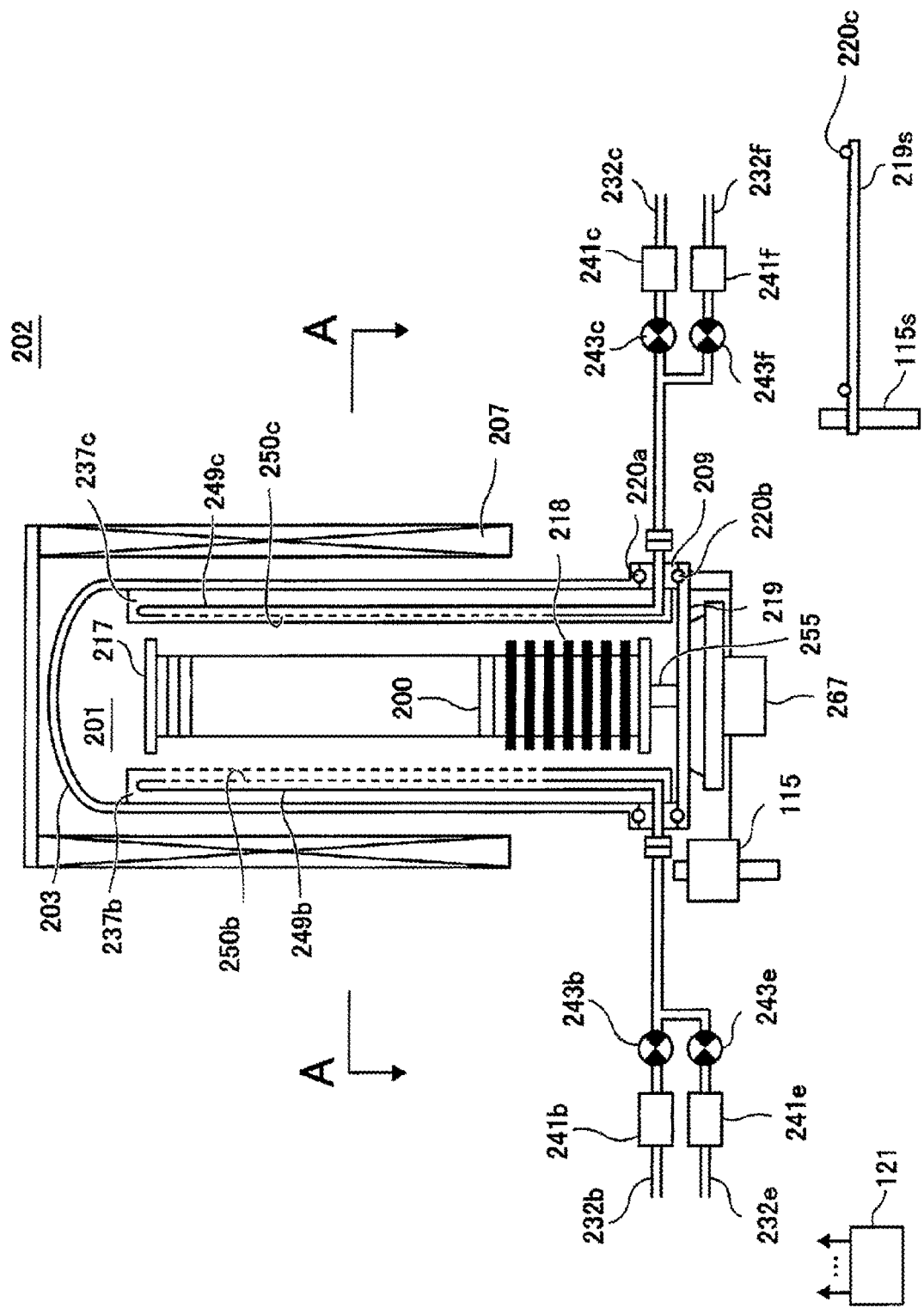
FIG. 2 is a schematic configuration diagram of a vertical type process furnace of the substrate processing apparatus suitably used in the embodiments of the present disclosure, in which a portion of the process furnace is shown in a vertical cross sectional view.

Nozzles 249a, 249b, and 249c are installed in the process chamber 201 to penetrate a sidewall of the manifold 209. A cross sectional view of a surface where the nozzle 249a can be seen is illustrated in FIG. 1, and a cross sectional view of a surface where the nozzles 249b and 249c can be seen is illustrated in FIG. 2.

Gas supply pipes 232a, 232b, and 232c are connected to the nozzles 249a, 249b, and 249c, respectively. In this manner, the three nozzles 249a, 249b, and 249c and the three gas supply pipes 232a, 232b, and 232c are installed in the reaction tube 203 to allow a plurality of kinds of gases to be supplied into the process chamber 201. Furthermore, when the manifold 209 is not installed and the reaction tube 203 is used as the process container, the nozzles 249a, 249b, and 249c may be installed to penetrate the sidewall of the reaction tube 203.

Mass flow controllers (MFCs) 241a, 241b, and 241c, which are flow rate controllers (flow rate control parts), and valves 243a, 243b, and 243c, which are opening/closing valves, are installed in the gas supply pipes 232a, 232b, and 232c sequentially from upstream sides of gas flow, respectively. Gas supply pipes 232d, 232e, and 232f, which supply inert gas, are respectively connected to the gas supply pipes 232a, 232b, and 232c at downstream sides of the valves 243a, 243b, and 243c. MFCs 241d, 241e, and 241f and valves 243d, 243e, and 243f are respectively installed in the gas supply pipes 232d, 232e, and 232f sequentially from upstream sides of gas flow.

Figure 3:
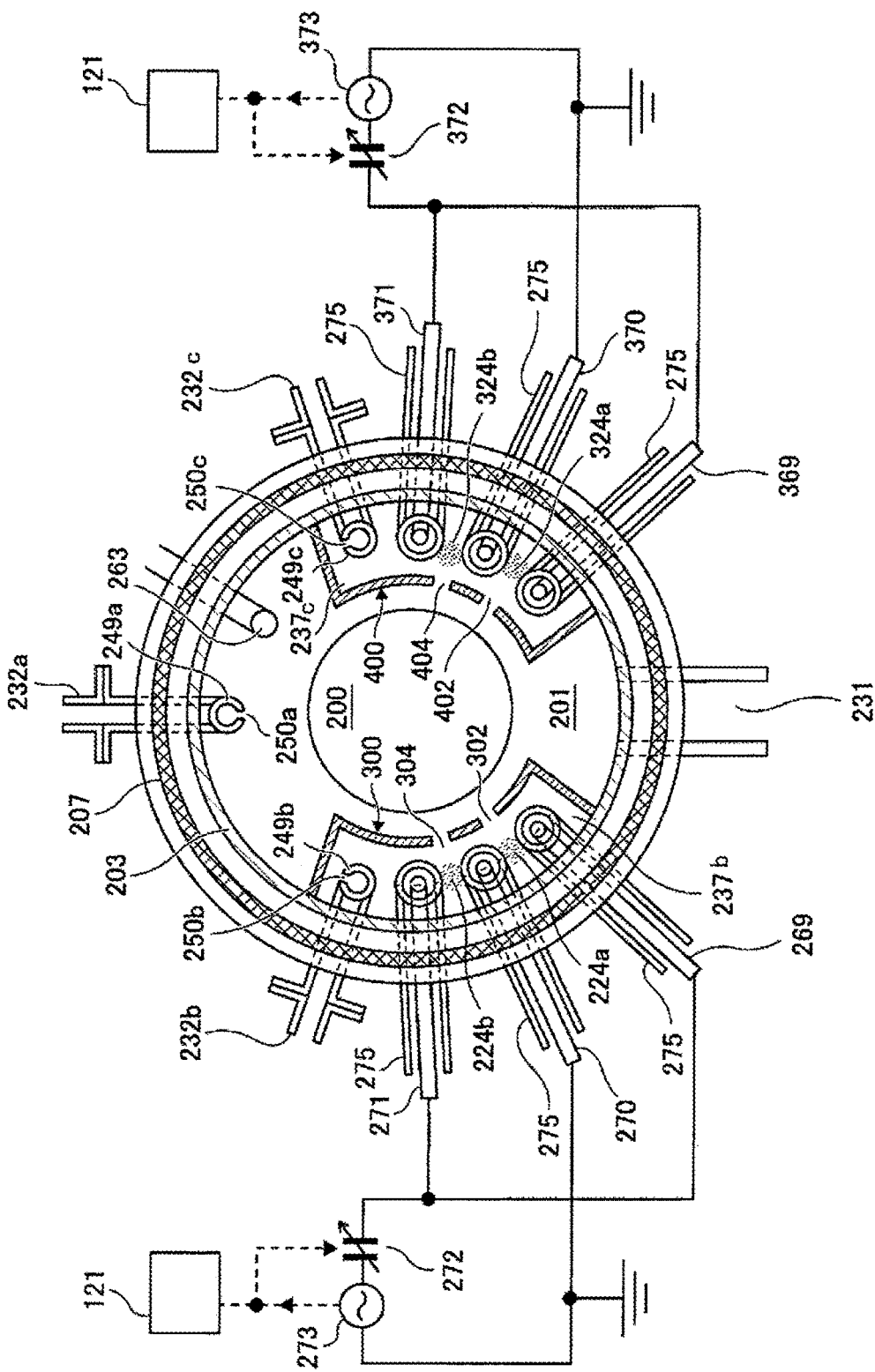
FIG. 3 is a schematic configuration diagram of a vertical type process furnace of the substrate processing apparatus suitably used in the embodiments of the present disclosure, in which a portion of the process furnace is shown in a cross sectional view taken along line A-A in FIG. 1.

As illustrated in FIG. 3, the nozzle 249a is installed in a space between an inner wall of the reaction tube 203 and the wafers 200 so as to extend upward along a stacking direction of the wafers 200 from a lower portion of the inner wall of the reaction tube 203 to an upper portion of the inner wall of the reaction tube 203. Specifically, the nozzle 249a is installed at a lateral side of a wafer arrangement region (mounting region) in which the wafers 200 are arranged (mounted), namely in a region which horizontally surrounds the wafer arrangement region, so as to extend along the wafer arrangement region. That is, the nozzle 249a is installed in a perpendicular relationship with the surfaces (flat surfaces) of the wafers 200 at a lateral side of the end portions (peripheral edge portions) of the wafers 200 loaded into the process chamber 201. Gas supply holes 250a for supplying a gas are formed on the side surface of the nozzle 249a. The gas supply holes 250a are opened toward the center of the reaction tube 203 so as to allow a gas to be supplied toward the wafers 200. The gas supply holes 250a may be formed in a plural number between a lower portion of the reaction tube 203 and an upper portion of the reaction tube 203. The respective gas supply holes 250a may have the same aperture area and may be formed at the same aperture pitch.

The nozzles 249b and 249c are installed within buffer chambers 237b and 237c, which are gas diffusion spaces, respectively. As illustrated in FIG. 3, the buffer chambers 237b and 237c are installed in a space with an annular plan-view shape between the inner wall of the reaction tube 203 and the wafers 200 such that the buffer chambers 237b and 237c extend along the stacking direction of the wafers 200 from the lower portion of the inner wall of the reaction tube 203 to the upper portion of the inner wall of the reaction tube 203. That is, the buffer chambers 237b and 237c are formed by buffer structures 300 and 400 at the lateral side of the wafer arrangement region, namely in the region which horizontally surrounds the wafer arrangement region, so as to extend along the wafer arrangement region. The buffer structures 300 and 400 are made of an insulating material such as quartz or the like, in which gas supply ports 302 and 304 for supplying gas are formed on a wall surface formed in a circular arc shape of the buffer structure 300 and gas supply ports 402 and 404 for supplying gas are formed on a wall surface formed in a circular arc shape of the buffer structure 400.

As illustrated in FIG. 3, the gas supply ports 302 and 304 are opened toward the center of the reaction tube 203 at such positions as to face plasma generation regions 224a and 224b between rod-shaped electrodes 269 and 270, and between rod-shaped electrodes 270 and 271, which will be described later, so as to allow gas to be supplied toward the wafers 200. The gas supply ports 302 and 304 are installed in a plural number between the lower portion of the reaction tube 203 and the upper portion of the reaction tube 203. The respective gas supply ports 302 and 304 may have the same aperture area and may be installed at the same aperture pitch. Similarly, the gas supply ports 402 and 404 are opened toward the center of the reaction tube 203 at such positions as to face plasma generation regions 324a and 324b between rod-shaped electrodes 369 and 370, and between rod-shaped electrodes 370 and 371 so as to allow gas to be supplied toward the wafers 200. The gas supply ports 402 and 404 are installed in a plural number between the lower portion of the reaction tube 203 and the upper portion of the reaction tube 203. The respective gas supply ports 402 and 404 may have the same aperture area and may be installed at the same aperture pitch.

The nozzles 249b and 249c are installed to extend upward along the stacking direction of the wafers 200 from the lower portion of the inner wall of the reaction tube 203 to the upper portion of the inner wall of the reaction tube 203. Specifically, the nozzles 249b and 249c are installed inside the buffer structures 300 and 400, respectively, at a lateral side of the wafer arrangement region in which the wafers 200 are arranged, namely in the region which horizontally surrounds the wafer arrangement region, so as to extend along the wafer arrangement region. That is, the nozzles 249b and 249c are installed in a perpendicular relationship with the surfaces of the wafers 200 at the lateral side of the end portions of the wafers 200 loaded into the process chamber 201.

Gas supply holes 250b for supplying gas are formed on the side surface of the nozzle 249b. The gas supply holes 250b are opened radially toward the wall surface formed in the circular arc shape of the buffer structure 300 (i.e., in a circumferential direction different from the opening directions of the gas supply ports 302 and 304) so as to allow gas to be supplied toward the wall surface. Thus, the reaction gas is dispersed in the buffer chamber 237b such that the reaction gas is prevented from being directly blown to the rod-shaped electrodes 269 to 271 and the generation of particles is suppressed. Similar to the gas supply holes 250a, the gas supply holes 250b are formed in a plural number between the lower portion of the reaction tube 203 and the upper portion of the reaction tube 203. The nozzle 249c also has the same structure as the nozzle 249b.

A precursor containing a predetermined element, for example, a silane precursor gas containing silicon (Si) as the predetermined element, is supplied from the gas supply pipe 232a into the process chamber 201 via the MFC 241a, the valve 243a, and the nozzle 249a.

As the silane precursor gas, it may be possible to use, for example, a precursor gas containing Si and a halogen element, i.e., a halosilane precursor gas. The halosilane precursor refers to a silane precursor having a halogen group. The halogen element contains at least one selected from a group of chlorine (Cl), fluorine (F), bromine (Br), and iodine (I).

As the halosilane precursor gas, it may be possible to use, for example, a precursor gas containing Si and Cl, i.e., a chlorosilane precursor gas. As the chlorosilane precursor gas, it may be possible to use, for example, dichlorosilane ($SiH_2Cl_2$, abbreviation: DCS) gas.

A reactant containing an element different from the aforementioned predetermined elements, for example, a nitrogen (N)-containing gas as a reaction gas, is supplied from the gas supply pipe 232b into the process chamber 201 via the MFC 241b, the valve 243b, and the nozzle 249b. As the N-containing gas, it may be possible to use, for example, a hydrogen nitride-based gas. The hydrogen nitride-based gas acts as a nitriding gas, i.e., a N source, which is a substance consisting of two elements of N and H. As the hydrogen nitride-based gas, it may be possible to use, for example, ammonia ($NH_3$) gas.

A modifying gas, for example, hydrogen ($H_2$) gas, is supplied from the gas supply pipe 232c into the process chamber 201 via the MFC 241c, the valve 243c, and the nozzle 249c.

An inert gas, for example, nitrogen ($N_2$) gas, is supplied from the gas supply pipes 232d, 232e and 232f into the process chamber 201 via the MFCs 241d, 241e and 241f, the valves 243d, 243e and 243f, the gas supply pipes 232a, 232b and 232c, and the nozzles 249a, 249b and 249c.

A precursor supply system as a first gas supply system mainly includes the gas supply pipe 232a, the MFC 241a, and the valve 243a. A reactant supply system as a second gas supply system mainly includes the gas supply pipe 232b, the MFC 241b, and the valve 243b. A modifying gas supply system as a third gas supply system mainly includes the gas supply pipe 232c, the MFC 241c, and the valve 243c. An inert gas supply system mainly includes the gas supply pipes 232d, 232e and 232f, the MFCs 241d, 241e and 241f, and the valves 243d, 243e and 243f. The precursor supply system, the reactant supply system, the modifying gas supply system, and the inert gas supply system will be generally and simply referred to as a gas supply system (gas supplier). As will be described hereinbelow, the second gas supply system and the third gas supply system may supply the same gas.

(Plasma Generation Device)

As illustrated in FIG. 3, three rod-shaped electrodes 269, 270, and 271 made of a conductor and having an elongated structure are disposed within the buffer chamber 237b along the arrangement direction of the wafers 200 from the lower portion of the reaction tube 203 to the upper portion of the reaction tube 203. The respective rod-shaped electrodes 269, 270, and 271 are installed parallel to the nozzle 249b. Each of the rod-shaped electrodes 269, 270, and 271 is covered with and protected by an electrode protection tube 275 from an upper portion to a lower portion of the rod-shaped electrodes 269, 270, and 271. The rod-shaped electrodes 269 and 271 disposed at both ends, among the rod-shaped electrodes 269, 270 and 271, are connected to the high-frequency power source 273 via a matcher 272. The rod-shaped electrode 270 is connected to ground which is a reference potential and is grounded. That is, the rod-shaped electrodes connected to the high-frequency power source 273 and the grounded rod-shaped electrode are alternately disposed, and the rod-shaped electrode 270 disposed between the rod-shaped electrodes 269 and 271 connected to the high-frequency power source 273 is commonly used for the rod-shaped electrodes 269 and 271 as the grounded rod-shaped electrode. In other words, the grounded rod-shaped electrode 270 is disposed to be sandwiched between the rod-shaped electrodes 269 and 271, which are adjacent to the grounded rod-shaped electrode 270 and connected to the high-frequency power source 273, so that the rod-shaped electrode 269 and the rod-shaped electrode 270, and similarly, the rod-shaped electrode 271 and the rod-shaped electrode 270 are respectively configured in pairs to generate plasma. That is, the grounded rod-shaped electrode 270 is commonly used for the two rod-shaped electrodes 269 and 271, which are adjacent to the grounded rod-shaped electrode 270 and connected to the high-frequency power source 273 to the rod-shaped electrode 270. Then, by applying high-frequency (RF) power from the high-frequency power source 273 to the rod-shaped electrodes 269 and 271, plasma is generated in the plasma generation region 224a between the rod-shaped electrodes 269 and 270 and in the plasma generation region 224b between the rod-shaped electrodes 270 and 271.

Similarly, as illustrated in FIG. 3, three rod-shaped electrodes 369, 370, and 371 made of a conductor and having an elongated structure are disposed within the buffer chamber 237c along the arrangement direction of the wafers 200 from the lower portion of the reaction tube 203 to the upper portion of the reaction tube 203. The three rod-shaped electrodes 369, 370, and 371 have the same configuration as the three rod-shaped electrodes 269, 270, and 271 described above.

Furthermore, a first plasma generator, which generates plasma in the plasma generation regions 224a and 224b, includes the rod-shaped electrodes 269, 270, and 271. Similarly, a second plasma generator, which generates plasma in the plasma generation regions 324a and 324b, includes the rod-shaped electrodes 369, 370, and 371. The electrode protection tube 275 may be regarded as being included in such a plasma generator. In addition, a plasma generation device includes high-frequency power sources 273 and 373, matchers 272 and 372, and the first and second plasma generators described above.

As will be described hereinbelow, the plasma generation device functions as a plasma exciter (activation mechanism)

for plasma-exciting (or activating) gas, namely exciting (or activating) gas to a plasma state. The plasma generation device includes the plurality of plasma generators as described above, and is used to perform a film-forming process by performing substrate processing using plasma generated by the plurality of plasma generators.

Furthermore, the high-frequency power sources 273 and 373 supply power to the plurality of plasma generators, respectively. The matchers 272 and 372 are installed between the two high-frequency power sources 273 and 373 and the two plasma generators to match the load impedances of the plasma generators with the output impedances of the high-frequency power sources 273 and 373.

The buffer structure 300 and the buffer structure 400 are installed in line symmetry to a line passing the centers of an exhaust pipe 231 and the reaction tube 203 with the exhaust pipe 231 interposed therebetween. In addition, the nozzle 249a is installed at a position to face the exhaust pipe 231 with the wafers 200 interposed therebetween. Furthermore, the nozzle 249b and the nozzle 249c are respectively installed at positions far from the exhaust pipe 231 in the buffer chamber 237.

The electrode protection tube 275 has a structure that enables the respective rod-shaped electrodes 269, 270, 271, 369, 370, and 371 to be inserted into the buffer chambers 237b and 237c in a state in which the rod-shaped electrodes 269, 270, 271, 369, 370, and 371 are isolated from the internal atmosphere of the buffer chambers 237b and 237c. If an $O_2$ concentration within the electrode protection tube 275 is substantially equal to an $O_2$ concentration in the ambient air (atmosphere), the rod-shaped electrodes 269, 270, 271, 369, 370, and 371 respectively inserted into the electrode protection tube 275 may be oxidized by the heat generated from the heater 207. Therefore, by filling an inert gas such as $N_2$ gas or the like into the electrode protection tube 275, or purging the interior of the electrode protection tube 275 with an inert gas such as $N_2$ gas or the like through the use of an inert gas purge mechanism, it is possible to reduce the $O_2$ concentration within the electrode protection tube 275 and to prevent the oxidation of the rod-shaped electrodes 269, 270, 271, 369, 370, and 371.

(Exhauster)

The exhaust pipe 231 configured to exhaust the internal atmosphere of the process chamber 201 is installed in the reaction tube 203. A vacuum pump 246 as a vacuum exhaust device is connected to the exhaust pipe 231 via a pressure sensor 245 as a pressure detector (pressure detection part) which detects the internal pressure of the process chamber 201 and an auto pressure controller (APC) valve 244 as an exhaust valve (pressure regulator). The APC valve 244 is configured to perform or stop vacuum exhaust of the interior of the process chamber 201 by opening or closing the APC valve 244 while operating the vacuum pump 246 and is also configured to adjust the internal pressure of the process chamber 201 by adjusting an opening degree of the APC valve 244 based on pressure information detected by the pressure sensor 245 while operating the vacuum pump 246. An exhaust system mainly includes the exhaust pipe 231, the APC valve 244 and the pressure sensor 245. The vacuum pump 246 may be regarded as being included in the exhaust system. The exhaust pipe 231 is not limited to being installed in the reaction tube 203 but may be installed in the manifold 209 just like the nozzles 249a, 249b and 249c.

A seal cap 219, which serves as a furnace opening cover configured to hermetically seal a lower end opening of the manifold 209, is installed under the manifold 209. The seal cap 219 is configured to make contact with the lower end of the manifold 209 at a lower side in the vertical direction. The seal cap 219 is made of a metal material such as, e.g., stainless steel (SUS) or the like, and is formed in a disc shape. An O-ring 220b, which is a seal member making contact with the lower end portion of the manifold 209, is installed on an upper surface of the seal cap 219. A rotation mechanism 267 configured to rotate a boat 217, which will be described later, is installed at the opposite side of the seal cap 219 from the process chamber 201. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up or down by a boat elevator 115 which is an elevator mechanism vertically installed outside the reaction tube 203. The boat elevator 115 is configured to load or unload the boat 217 into or from the process chamber 201 by moving the seal cap 219 up or down. The boat elevator 115 is configured as a transfer device (transfer mechanism) which transfers the boat 217, i.e., the wafers 200, into or out of the process chamber 201. Furthermore, a shutter 219s as a furnace opening cover capable of hermetically seal the lower end opening of the manifold 209 while moving the seal cap 219 down with the boat elevator 115 is installed under the manifold 209. The shutter 219s is made of metal such as, e.g., stainless steel (SUS) or the like, and is formed in a disc shape. An O-ring 220c as a seal member making contact with the lower end portion of the manifold 209 is installed on an upper surface of the shutter 219s. An opening/closing operation (an up/down movement operation or a rotational movement operation) of the shutter 219s is controlled by a shutter opening/closing mechanism 115s.

(Substrate Support)

As illustrated in FIGS. 1 and 2, the boat 217 serving as a substrate support is configured to support one or a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship with a predetermined space. The boat 217 is made of a heat resistant material such as quartz or SiC. Heat-insulating plates 218 made of a heat resistant material such as quartz or SiC are installed below the boat 217 in multiple stages.

As illustrated in FIG. 3, a temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203 like the nozzles 249a, 249b, and 249c.

(Control Device)

Figure 4:
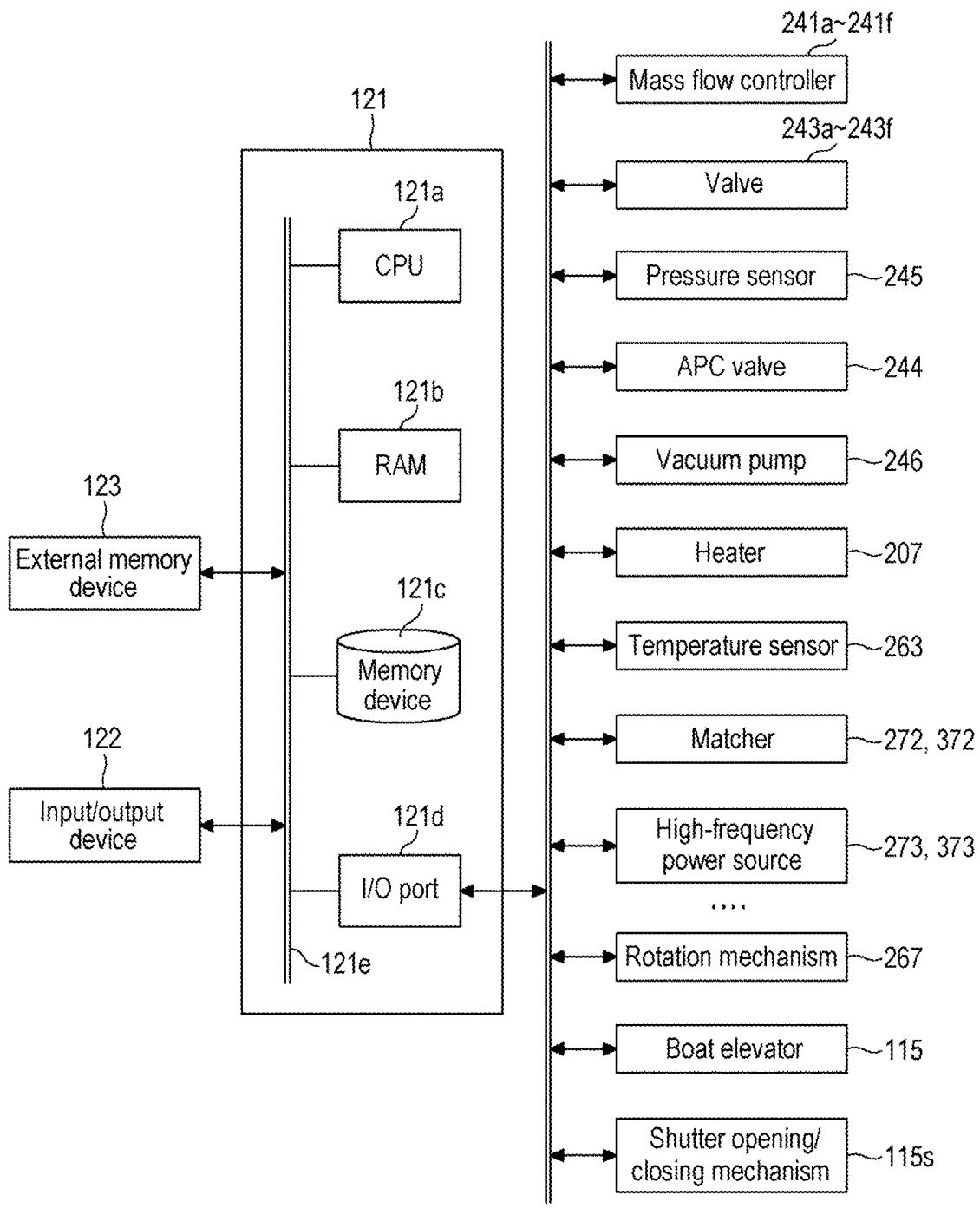
FIG. 4 is a schematic configuration diagram of a controller of the substrate processing apparatus suitably used in the embodiments of the present disclosure, in which a control system of the controller is shown in a block diagram.

Next, a control device will be described with reference to FIG. 4. As illustrated in FIG. 4, a controller 121, which is a control part (control device), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a hard disk drive (HDD), or the like. A control program for controlling operations of a substrate processing apparatus, a process recipe for specifying sequences and conditions of a film-forming process as described hereinbelow, or the like is readably stored in the memory device 121c. The process recipe functions as a program for causing the controller 121 to execute each sequence in various processing (film-forming process), as described hereinbelow, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program, data or the like read by the CPU 121a is temporarily stored.

The I/O port 121d is connected to the MFCs 241a to 241f, the valves 243a to 243f, the pressure sensor 245, the APC valve 244, the vacuum pump 246, the heater 207, the temperature sensor 263, the matchers 272 and 372, the high-frequency power sources 273 and 373, the rotation mechanism 267, the boat elevator 115, the shutter opening/closing mechanism 115s, and the like, as described above.

The CPU 121a is configured to read and execute the control program from the memory device 121c. The CPU 121a also reads the recipe from the memory device 121c according to an input of an operation command from the input/output device 122. In addition, the CPU 121a is configured to control, according to the contents of the recipe thus read, the control of the rotation mechanism 267, the flow rate adjusting operation of various kinds of gases by the MFCs 241a to 241f, the opening/closing operation of the valves 243a to 243f, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of forwardly and reversely rotating the boat 217 with the rotation mechanism 267 and adjusting the rotation angle and the rotation speed of the boat 217, the operation of moving the boat 217 up or down with the boat elevator 115, and the like.

The controller 121 may be configured by installing, on the computer, the aforementioned program stored in an external memory device 123 (for example, a magnetic disc such as a hard disk, an optical disc such as a CD, a magneto-optical disc such as an MO, a semiconductor memory such as a USB memory, or the like). The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using communication means such as the Internet or a dedicated line, instead of using the external memory device 123.

(2) Substrate Processing

Figure 5:
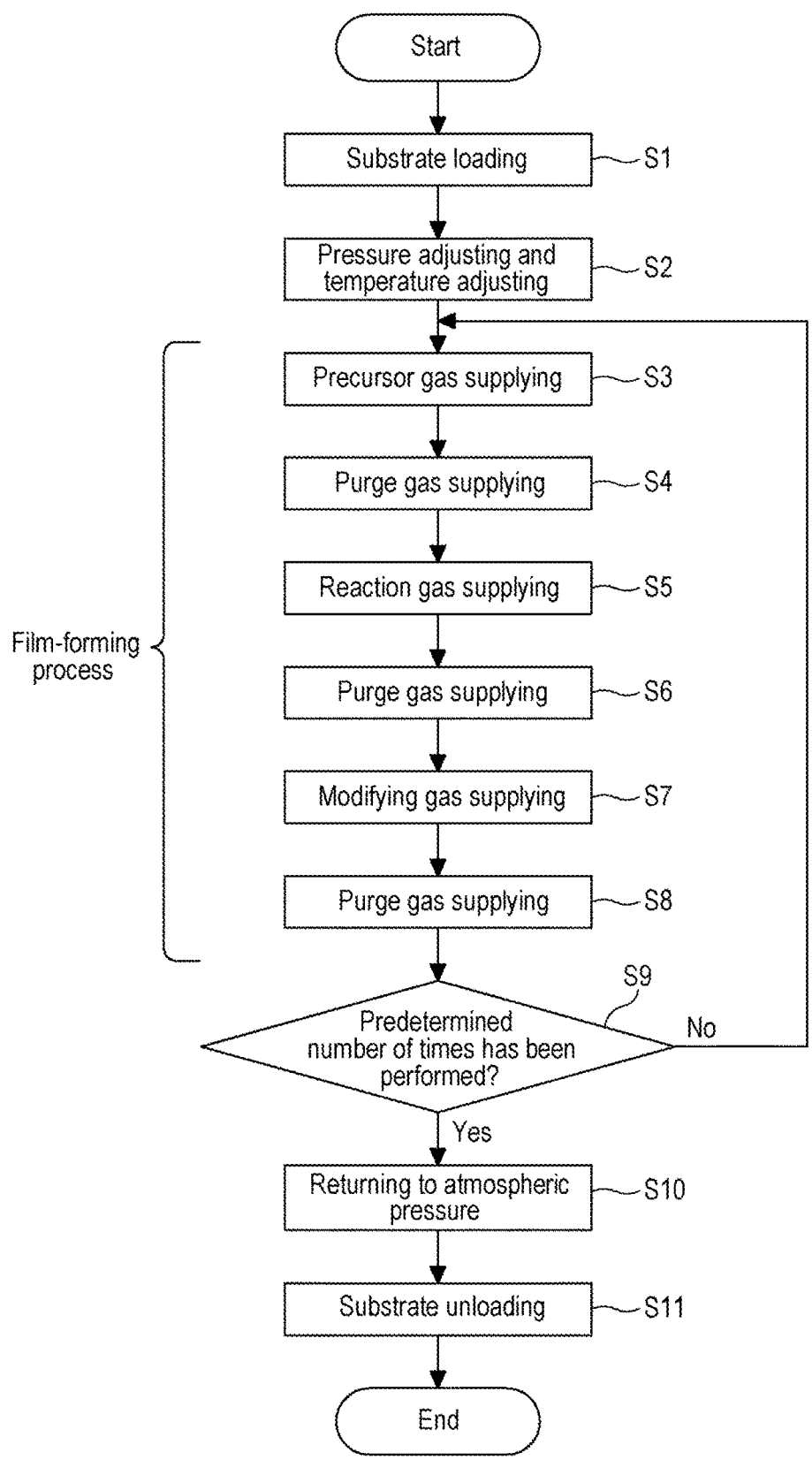
FIG. 5 is a flowchart illustrating substrate processing according to the embodiments of the present disclosure.
Figure 6:
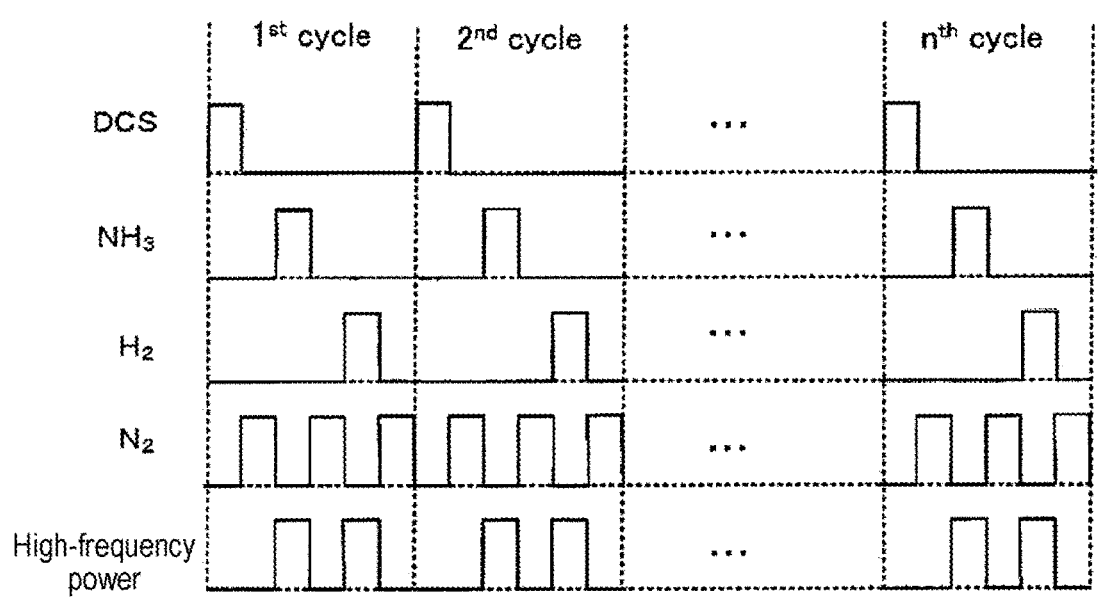
FIG. 6 illustrates a timing diagram of gas supply in the substrate processing according to the embodiments of the present disclosure.

Next, forming a thin film on a wafer 200 using the substrate processing apparatus of the present embodiments, which is one of the processes for manufacturing a semiconductor device, will be described with reference to FIGS. 5 and 6. In the following descriptions, the operations of the respective parts constituting the substrate processing apparatus are controlled by the controller 121.

Examples in which an operation of supplying DCS gas as a precursor gas, an operation of supplying plasma-excited $NH_3$ gas as a reaction gas, and an operation of supplying plasma-excited $H_2$ gas as a modifying gas are performed a predetermined number of times (once or more) non-synchronously, i.e., without being synchronized, to form a silicon nitride film (SiN film) as a film containing Si and N on a wafer 200 will be described herein. For example, a predetermined film may be formed in advance on the wafer 200. A predetermined pattern may also be formed in advance on the wafer 200 or the predetermined film.

In the present disclosure, for the sake of convenience, the process flow of the film-forming process illustrated in FIG. 5 may sometimes be denoted as follows. The same denotation will be used in other embodiments as described hereinbelow.

$$(DCS \rightarrow NH_3^* \rightarrow H_2^*) \times n \Rightarrow SiN$$

When the term "wafer" is used herein, it may refer to "a wafer itself" or "a laminated body of a wafer and a predetermined layer or film formed on the surface of the wafer". In addition, when the phrase "a surface of a wafer" is used herein, it may refer to a surface of a wafer itself or a surface of a predetermined layer or the like formed on a wafer. Furthermore, in the present disclosure, the expression "a predetermined layer is formed on a wafer" may mean that a predetermined layer is directly formed on a surface of a wafer itself or that a predetermined layer is formed on a layer or the like formed on a wafer. In addition, when the term "substrate" is used herein, it may be synonymous with the term "wafer."

(Loading: S1)

If a plurality of wafers 200 is charged on the boat 217 (wafer charging), the shutter 219s is moved by the shutter opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 through the O-ring 220b.

(Pressure Adjusting and Temperature Adjusting: S2)

The interior of the process chamber 201, namely the space in which the wafers 200 are located, is vacuum-exhausted (depressurization-exhausted) by the vacuum pump 246 to reach a desired pressure (degree of vacuum). In this operation, the internal pressure of the process chamber 201 is measured by the pressure sensor 245. The APC valve 244 is feedback-controlled based on the measured pressure information. Furthermore, the wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 has a desired temperature distribution. In addition, the rotation of the boat 217 and the wafers 200 by the rotation mechanism 267 begins. The exhaust of the interior of the process chamber 201 and the heating and rotation of the wafers 200 may be all continuously performed at least until the processing of the wafers 200 is completed.

(Film-Forming: S3, S4, S5, S6, S7, and S8)

Thereafter, film-forming is performed by sequentially executing S3, S4, S5, S6, S7, and S8.

(Precursor Gas Supplying: S3 and S4)

At S3, DCS gas is supplied to the wafer 200 accommodated within the process chamber 201.

The valve 243a is opened to allow the DCS gas to flow through the gas supply pipe 232a. The flow rate of the DCS gas is adjusted by the MFC 241a. The DCS gas is supplied from the gas supply holes 250a into the process chamber 201 via the nozzle 249a and is exhausted from the exhaust pipe 231. Simultaneously, the valve 243d may be opened to allow $N_2$ gas to flow through the gas supply pipe 232d. The flow rate of the $N_2$ gas is adjusted by the MFC 241d. The $N_2$ gas is supplied into the process chamber 201 together with the DCS gas and is exhausted from the exhaust pipe 231.

Furthermore, in order to prevent the DCS gas from entering the nozzles 249b and 249c, the valves 243e and 243f may be opened to allow $N_2$ gas to flow through the gas supply pipes 232e and 232f. The $N_2$ gas is supplied into the process chamber 201 via the gas supply pipes 232b and 232c and the nozzles 249b and 249c and is exhausted from the exhaust pipe 231.

The supply flow rate of the DCS gas controlled by the MFC 241a may be set at a flow rate which falls within a range of, for example, 1 to 6,000 sccm, or 2,000 to 3,000 sccm in some embodiments. Each of the supply flow rates of the $N_2$ gas controlled by the MFCs 241d, 241e, and 241f may be set at a flow rate which falls within a range of, for example, 100 to 10,000 sccm. The internal pressure of the process chamber 201 may be set at a pressure which falls within a range of, for example, 1 to 2,666 Pa, or 665 to 1,333 Pa in some embodiments. The supply time of the DCS gas may be set at a time which falls within a range of, for example, 1 to 10 seconds, or 1 to 3 seconds in some embodiments.

The temperature of the heater 207 is set such that the temperature of the wafer 200 becomes a temperature which falls within a range of, for example, 0 to 700 degrees C., a room temperature (25 degrees C.) to 550 degrees C. in some embodiments, or 40 to 500 degrees C. in some embodiments. By setting the temperature of the wafer 200 to 700 degrees C. or lower, further to 550 degrees C. or lower, and furthermore to 500 degrees C. or lower as in the present embodiments, it is possible to reduce the quantity of heat applied to the wafer 200, and to control the thermal history received by the wafer 200.

By supplying the DCS gas to the wafer 200 under the aforementioned conditions, a Si-containing layer containing Cl is formed on the wafer 200 (an underlayer film on its surface). The Si-containing layer containing Cl may be a Si layer containing Cl or an adsorption layer of DCS, or may include both of them. Hereinafter, the Si-containing layer containing Cl will be simply referred to as a Si-containing layer.

After the Si-containing layer is formed, the valve 243a is closed to stop the supply of the DCS gas into the process chamber 201. In this operation, the interior of the process chamber 201 is vacuum-exhausted by the vacuum pump 246 while maintaining the APC valve 244 opened. Thus, the DCS gas which has not reacted, the DCS gas which has contributed to the formation of the Si-containing layer, or reaction byproduct, or the like, which remains within the process chamber 201, is removed from the interior of the process chamber 201 (S4). Furthermore, the supply of the $N_2$ gas into the process chamber 201 is maintained while maintaining the valves 243d, 243e, and 243f opened. The $N_2$ gas acts as a purge gas. This S4 may also be omitted.

As the precursor gas, it may be possible to suitably use, various kinds of aminosilane precursor gases such as tetrakis-dimethylaminosilane gas, tris-dimethylaminosilane gas, bis-dimethylaminosilane gas, bis-diethylaminosilane gas, bis-tertiary-butylaminosilane gas, dimethylaminosilane gas, diethylaminosilane gas, dipropylaminosilane gas, diisopropylaminosilane gas, butylaminosilane gas, hexamethyldisilazane gas, or the like, an inorganic halosilane precursor gases such as monochlorosilane gas, trichlorosilane gas, tetrachlorosilane gas, hexachlorodisilane gas, octachlorotrisilane gas, or the like, or a halogen group-free inorganic silane precursor gas such as monosilane gas, disilane gas, trisilane gas, or the like, as well as the DCS gas.

As the inert gas, it may be possible to use, a rare gas such as Ar gas, He gas, Ne gas, Xe gas, or the like, as well as the $N_2$ gas.

(Reaction Gas Supplying: S5 and S6)

After the film-forming process is completed, plasma-excited $NH_3$ gas as a reaction gas is supplied to the wafer 200 in the process chamber 201 (S5).

At this operation, the opening/closing control of the valves 243b and 243d to 243f is performed in the same procedure as the opening/closing control of the valves 243a and 243d to 243f at S3. The flow rate of the $NH_3$ gas is adjusted by the MFC 241b. The $NH_3$ gas is supplied into the buffer chamber 237b via the nozzle 249b. In this operation, high-frequency power is supplied to between the rod-shaped electrodes 269, 270, and 271. The $NH_3$ gas supplied into the buffer chamber 237b is plasma-excited (activated into plasma). The plasma-excited $NH_3$ gas is supplied as active species ($NH_3$*) into the process chamber 201 and is exhausted from the exhaust pipe 231.

The supply flow rate of the $NH_3$ gas controlled by the MFC 241b may be set at a flow rate which falls within a range of, for example, 100 to 10,000 sccm, or 1,000 to 2,000 sccm in some embodiments. The high-frequency power applied to the rod-shaped electrodes 269, 270, and 271 may be set at electric power which falls within a range of, for example, 50 to 600 W. The internal pressure of the process chamber 201 may be set at a pressure which falls within a range of, for example, 1 to 500 Pa. By using plasma, the $NH_3$ gas can be activated even when the internal pressure of the process chamber 201 is set to such a relatively low pressure range. The time, during which the active species obtained by plasma-exciting the $NH_3$ gas are supplied to the wafer 200, namely the gas supply time (irradiation time), may be set at a time which falls within a range of, for example, 1 to 180 seconds, or 1 to 60 seconds in some embodiments. Other processing conditions may be similar to the processing conditions of S3 described above.

By supplying the $NH_3$ gas to the wafer 200 under the aforementioned conditions, the Si-containing layer formed on the wafer 200 is plasma-nitrided. In this operation, Si—Cl bonds and Si—H bonds of the Si-containing layer are broken by the energy of the plasma-excited $NH_3$ gas. Cl and H, from which the bonds with Si are broken, are desorbed from the Si-containing layer. Then, Si in the Si-containing layer, which has dangling bonds due to the desorption of Cl or the like, is bonded to N contained in the $NH_3$ gas to form Si—N bonds. As this reaction proceeds, the Si-containing layer is modified into a layer containing Si and N, i.e., a silicon nitride layer (SiN layer). A process accompanied by this modification may be referred to as a modifying process.

Furthermore, in order to modify the Si-containing layer into the SiN layer, the $NH_3$ gas may be plasma-excited and supplied. This is because, even if the $NH_3$ gas is supplied under a non-plasma atmosphere, the energy needed for nitriding the Si-containing layer may be insufficient in the aforementioned temperature range and it may be difficult to sufficiently desorb Cl and H from the Si-containing layer, to sufficiently nitride the Si-containing layer, and to increase the Si—N bonds.

After the Si-containing layer is modified into the SiN layer, the valve 243b is closed to stop the supply of the NH$_3$ gas. Furthermore, the supply of the high-frequency power to between the rod-shaped electrodes 269, 270 and 271 is stopped. Then, the NH$_3$ gas or reaction byproduct, which remains within the process chamber 201, is removed from the interior of the process chamber 201 under the same processing procedures and processing conditions as those of S4 (S6). This S6 may also be omitted.

As a nitriding agent, i.e., a plasma-excited NH$_3$-containing gas, it may be possible to use, diazene (N$_2$H$_2$) gas, hydrazine (N$_2$H$_4$) gas, N$_3$H$_8$ gas, or the like, as well as the NH$_3$ gas.

As the inert gas, it may be possible to use, for example, various kinds of rare gases exemplified at S4, as well as the N$_2$ gas.

(Modifying Gas Supplying: S7 and S8)

After the modifying process for modifying the Si-containing layer into the SiN layer is completed, plasma-excited H$_2$ gas as a modifying gas is supplied to the wafer 200 in the process chamber 201 (S7).

At this operation, the opening/closing control of the valves 243c and 243d to 243f is performed in the same procedure as the opening/closing control of the valves 243a and 243d to 243f at S3. The flow rate of the H$_2$ gas is adjusted by the MFC 241c. The H$_2$ gas is supplied into the buffer chamber 237c via the nozzle 249c. In this operation, high-frequency power is supplied to between the rod-shaped electrodes 369, 370, and 371. The H$_2$ gas supplied into the buffer chamber 237c is plasma-excited (activated into plasma). The plasma-excited H$_2$ gas is supplied as active species (H$_2$*) into the process chamber 201 and is exhausted from the exhaust pipe 231.

By supplying the plasma-excited H$_2$ gas, i.e., active species of hydrogen (H$_2$*), to the SiN layer formed by the aforementioned operation, chlorine atoms existing in the SiN layer formed on the wafer 200 can be removed and the SiN layer of high quality can be obtained (modified).

Thereafter, the valve 243c is closed to stop the supply of the H$_2$ gas. Furthermore, the supply of the high-frequency power to between the rod-shaped electrodes 369, 370, and 371 is stopped. Then, the H$_2$ gas or reaction byproduct, which remains within the process chamber 201, is removed from the interior of the process chamber 201 under the same processing procedures and processing conditions as those of S4 and S6 (S8). This S8 may also be omitted.

As the inert gas, it may be possible to use, for example, various kinds of rare gases exemplified at S4, as well as the N$_2$ gas.

(Performing Predetermined Number of Times: S9)

A process that performs foregoing S3, S4, S5, S6, S7, and S8 in this order non-simultaneously, i.e., non-synchronously, is set as one cycle, and this cycle is performed a predetermined number of times (n times), namely once or more (S9). As a result, a SiN film having a predetermined composition and a predetermined thickness can be formed on the wafer 200. The aforementioned cycle may be repeated multiple times. That is, the thickness of the SiN layer formed per one cycle may be set smaller than a desired thickness, and the aforementioned cycle may be repeated multiple times until the thickness of the SiN film formed by laminating the SiN layer becomes the desired thickness.

(Returning to Atmospheric Pressure: S10)

After the film-forming process described above is completed, the N$_2$ gas as an inert gas is supplied from the respective gas supply pipes 232d, 232e, and 232f into the process chamber 201 and is exhausted from the exhaust pipe 231. Thus, the interior of the process chamber 201 is purged with an inert gas and the gas or the like remaining within the process chamber 201 is removed from the interior of the process chamber 201 (inert gas purge). Thereafter, the internal atmosphere of the process chamber 201 is substituted by an inert gas (inert gas substitution). The internal pressure of the process chamber 201 is returned to an atmospheric pressure (S10).

(Unloading: S11)

Thereafter, the seal cap 219 is moved down by the boat elevator 115 to open the lower end of the manifold 209. The processed wafers 200 supported on the boat 217 are unloaded from the lower end of the manifold 209 to the outside of the reaction tube 203 (boat unloading) (S11). After the boat unloading, the shutter 219s is moved so that the lower end opening of the manifold 209 is sealed by the shutter 219s through the O-ring 220c (shutter closing). The processed wafers 200 are unloaded to the outside of the reaction tube 203 and are subsequently discharged from the boat 217 (wafer discharging). After the wafer discharging, an empty boat 217 may be loaded into the process chamber 201.

As described above, in the present embodiments, the substrate processing is performed on the wafers 200 by the substrate processing method as described above to manufacture a semiconductor device. That is, the method of manufacturing a semiconductor device is realized by performing loading the wafers 200 into the process chamber 201 of the substrate processing apparatus of the present embodiments, processing the loaded wafers 200 by supplying the process gas plasma-excited by the plasma generation device into the process chamber 201, and unloading the processed wafers 200 from the process chamber 201. Furthermore, the controller 121 functions as a plasma control device which controls the plasma generating process described above.

In addition, the second gas supply system and the third gas supply system may supply the same gas. That is, for example, it may be configured so that the same reactant is supplied by the second gas supply system and the third gas supply system, setting the second gas supply system as the first reactant supply system and the third gas supply system as the second reactant supply system.

Figure 7:
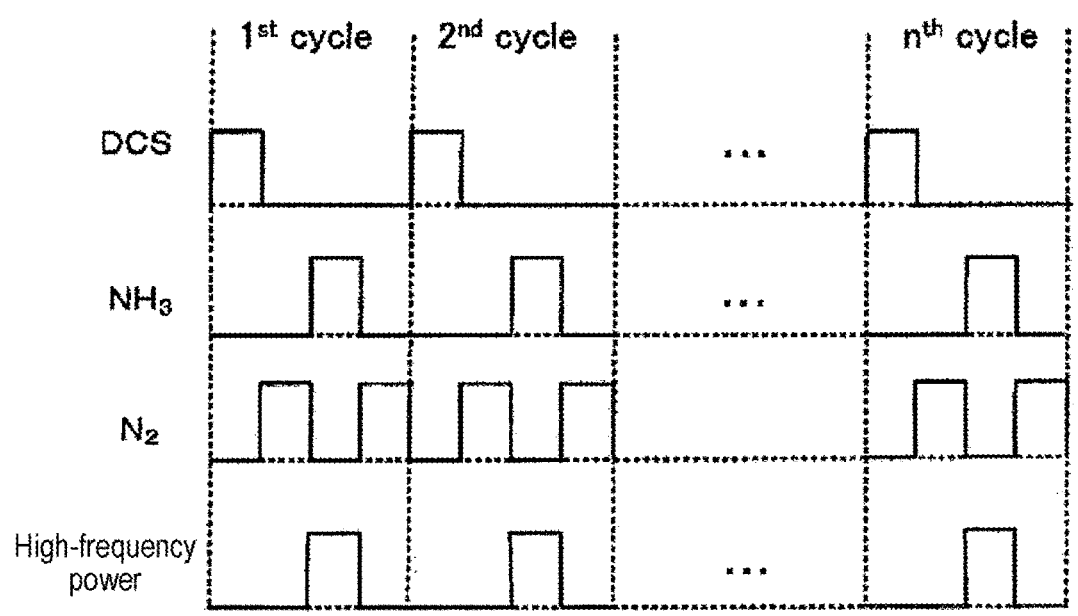
FIG. 7 illustrates a timing diagram of gas supply in another substrate processing according to the embodiments of the present disclosure.

For example, as illustrated in FIG. 7, the DCS gas may be supplied as the precursor gas, and the NH$_3$ gas may be supplied as the same reactant from the second gas supply system and the third gas supply system. In this operation, sources of the NH$_3$ gas may be the same or may be individually arranged.

In this case, the operation of supplying the DCS gas as the precursor gas and the operation of supplying the plasma-excited NH$_3$ gas as the reaction gas are performed a predetermined number of times (once or more) non-simultaneously, i.e., non-synchronously. Thus, a silicon nitride film (SiN film) is formed as a film containing Si and N on the wafer 200, and the reaction process is as follows.

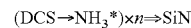

(DCS→NH$_3$*)×n⇒SiN (3) Adjustment of the Matchers 272 and 372

Next, a process for performing impedance matching, in which the matchers 272 and 372 are adjusted to match the load impedances of the plasma generators with the output impedances of the high-frequency power sources 273 and 373, will be described.

First, a configuration of the high-frequency power sources 273 and 373 will be described with reference to FIG. 8.

Figure 8:
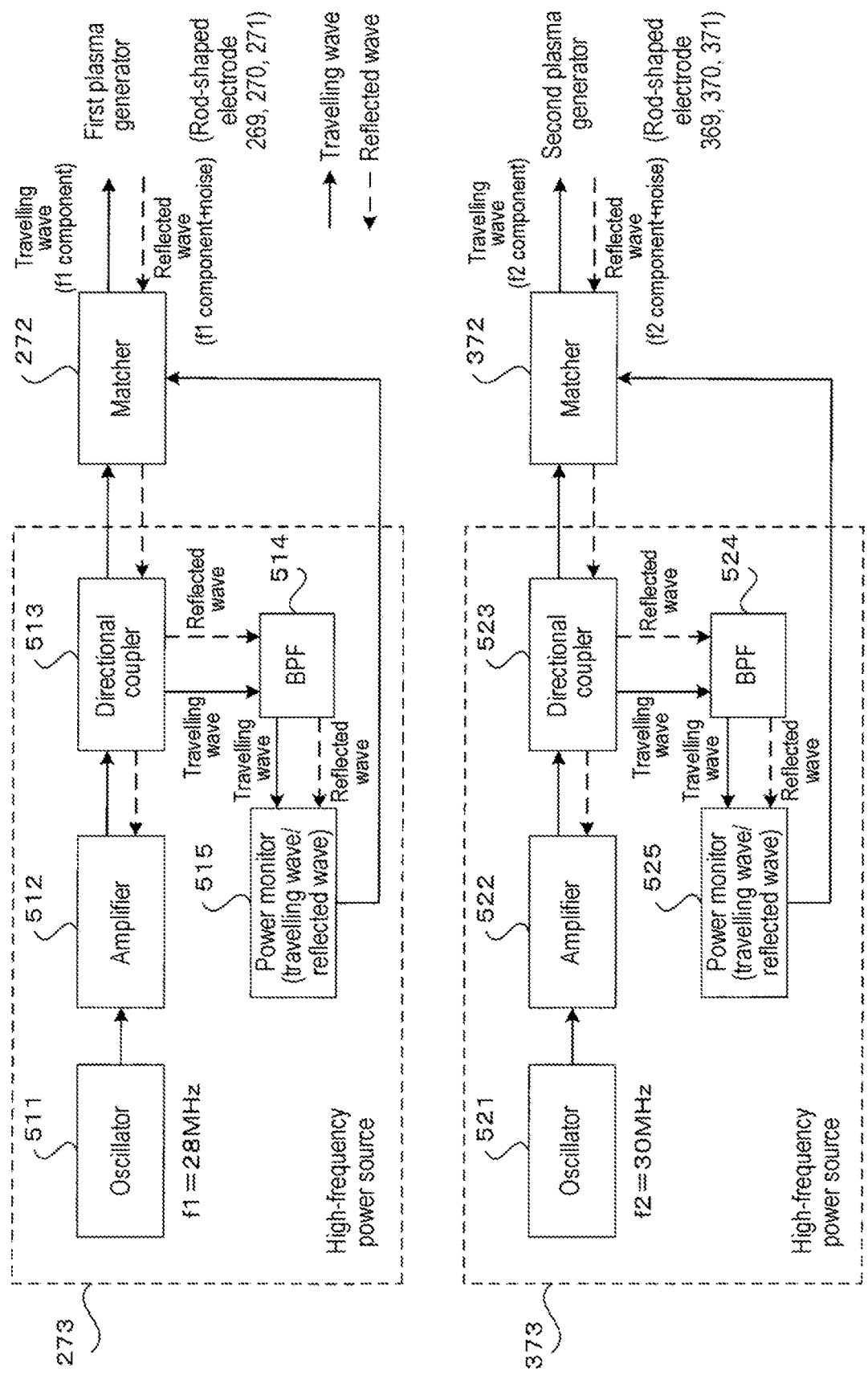
FIG. 8 is a diagram illustrating a configuration of high-frequency power sources 273 and 373.

As illustrated in FIG. 8, the high-frequency power source 273 includes an oscillator 511, an amplifier 512, a directional coupler (coupler) 513, a band-pass filter (hereinafter, abbreviated as a BPF) 514, and a power monitor 515.

As illustrated in FIG. 8, the high-frequency power source 273 and the high-frequency power source 373 have the same configuration, and the oscillator (high-frequency oscillator) 511, the amplifier 512, the directional coupler 513, the BPF 514 and the power monitor 515 are configured to correspond to an oscillator 521, an amplifier 522, a directional coupler 523, a BPF 524, and a power monitor 525, respectively. Therefore, in the following description, the configuration of the high-frequency power source 273 will be mainly described.

The descriptions for the present embodiments are based on that the oscillator 511 oscillates a high-frequency of 28 MHz (frequency f1) and the oscillator 521 in the high-frequency power source 373 oscillates a high-frequency of 30 MHz (frequency f2). The oscillation frequencies of the oscillators 511 and 521 are not limited thereto, and a frequency band such as, e.g., 13.56 MHz, may be used.

The amplifier 512 amplifies the high-frequency oscillated by the oscillator 511 and outputs it to the directional coupler 513.

The directional coupler 513 is disposed at a subsequent stage of the oscillator 511 to extract a part of a traveling wave component from the oscillator 511 and a part of a reflected wave component from the matcher 272.

The BPF 514 is a filter for removing a noise signal included in the reflected wave component extracted by the directional coupler 513. The BPF 514 includes two filters having the same characteristics, and is configured to pass the traveling wave component extracted by the directional coupler 513 through the BPF 514 in order to cancel the phase deviation between the reflected wave component and the traveling wave component.

Furthermore, the power monitor 515 measures a ratio (reflection coefficient) between the reflected wave component after passing through the BPF 514 and the traveling wave component which has been extracted by the directional coupler 513 and then has passed through the BPF 514, and feedback-controls the matcher 272 so that the value of the ratio becomes small and controls so that the phase difference between the reflected wave component and the traveling wave component becomes small.

In addition, the BPFs 514 and 524 are band-pass filters for removing noise caused by a difference in oscillation frequencies between the oscillators 511 and 521 of the two high-frequency power sources 273 and 373. Specifically, the BPF 514 is set to have a pass band for removing noise of a 2 MHz (=|f1−f2|) component, which is the difference in oscillation frequencies between the two oscillators 511 and 521, and its harmonic component. Furthermore, the pass bands of the BPFs 514 and 524 are set to be within a frequency range so as to pass the oscillation frequencies 28 MHz and 30 MHz of the oscillators 511 and 521 of the two high-frequency power sources 273 and 373. That is, the pass band of the BPF 514 is set to a pass band from 26 to 30 MHz, which is ±2 MHz when its center frequency is 28 MHz, and the pass band of the BPF 524 is set to a pass band from 28 MHz to 32 MHz, which is ±2 MHz when its center frequency is 30 MHz.

Figure 9:
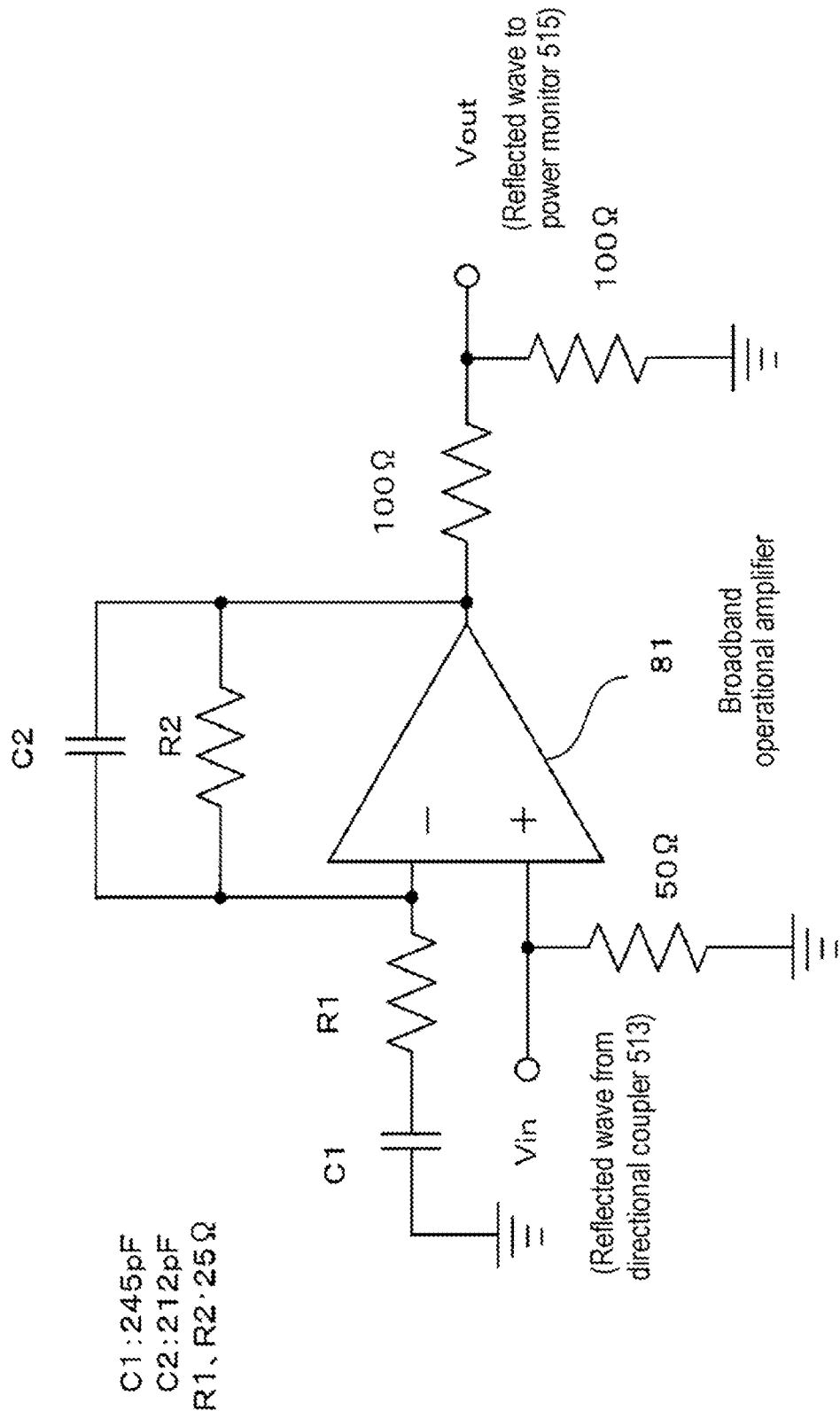
FIG. 9 is a diagram illustrating a specific example of a circuit configuration of a BPF (By-Pass Filter) 514.
Figure 10:
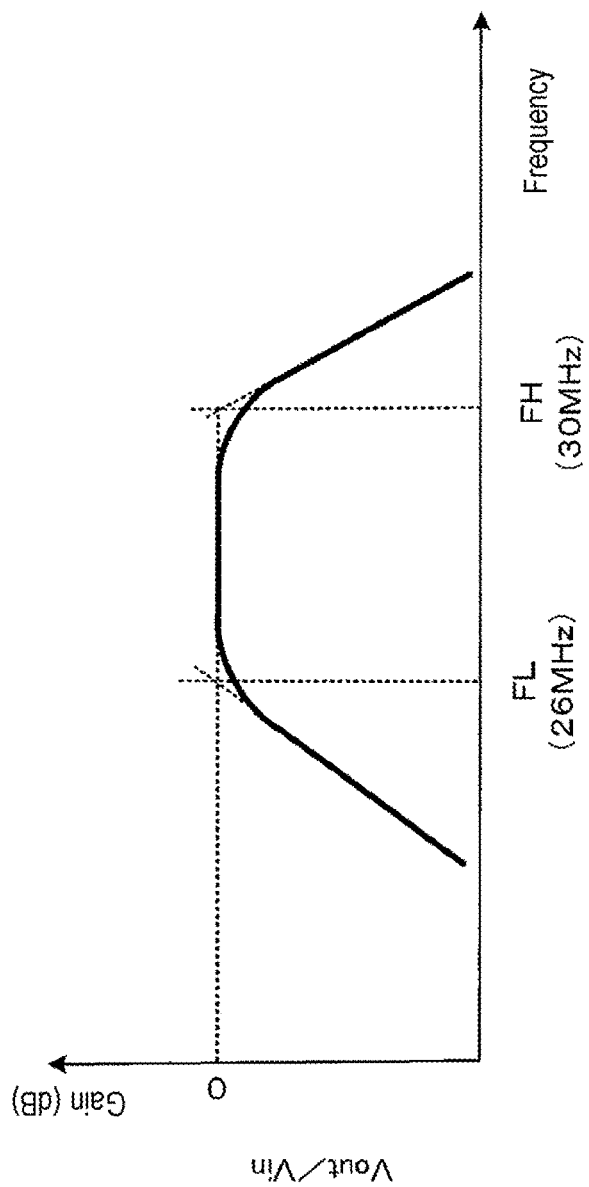
FIG. 10 is a diagram illustrating frequency characteristics of the BPF 514 in FIG. 9.

A specific circuit configuration example of the BPF 514 is illustrated in FIG. 9, and its frequency characteristics are illustrated in FIG. 10. Furthermore, only the filter configuration for removing noise of the reflected wave component input to the BPF 514 is illustrated in FIG. 9, but the traveling wave component extracted by the directional coupler 513 also passes through the same filter configuration.

The circuit configuration of the BPF 514 is configured as a non-inverting amplifier using a broadband operational amplifier (operational amplifier) 81, in which the reflected wave from the directional coupler 513 is input to a non-inverting input terminal as an input signal Vin. In addition, circuit elements such as capacitors C1 and C2 and resistors R1 and R2 are connected to the broadband operational amplifier 81, which in turn has a circuit configuration that outputs an output signal Vout to the power monitor 515.

Furthermore, in the circuit configuration illustrated in FIG. 9, it is assumed that C1 is 245 pF, C2 is 212 pF, and R1 and R2 are each 25 Ω. Therefore, as illustrated in FIG. 10, a lower cutoff frequency FL ($1/(2\pi \cdot C1 \cdot R1)$) of the BPF 514 is about 26 MHz, and an upper cutoff frequency FH ($1/(2\pi \cdot C2 \cdot R2)$) thereof is about 30 MHz. For the BPF 524, it is assumed that C1 is 227 pF, C2 is 200 pF, FL is about 28 MHz, and FH is about 32 MHz.

That is, the BPF 514 (524) is set to have frequency characteristics so as to pass the frequency component of 28 MHz (30 MHz) which is an oscillation frequency of the oscillator 511 (521) and to remove a noise signal of 2 MHz which is a difference frequency between the two oscillation frequency.

Therefore, the BPFs 514 and 524 pass signals of the reflected component and the traveling wave component separated by the directional couplers 513 and 523 without large loss, and remove only the noise components.

As a result, the feedback control of the matchers 272 and 372 performed to the power monitors 515 and 525 is also accurately performed without being significantly affected by the noise components, and the film formation characteristics and etching characteristics in the first plasma generator and the second plasma generator are stabilized and the productivity and stability for wafer processing are improved.

That is, according to the present embodiments, the effect of performing stable plasma generation can be achieved even when plasma generation is performed using the plurality of high-frequency power sources 273 and 373.

Moreover, in the case where an attempt is made to implement uniform substrate processing characteristics and film formation characteristics, causing as little difference as possible between the plasma characteristics in the first plasma generator and the plasma characteristics in the second plasma generator, the high-frequency power sources 273 and 373 may have the same oscillation frequency as much as possible.

However, even if it is attempted to make the oscillation frequencies of the oscillators 511 and 521 identical to each other, it is difficult to configure a plurality of oscillators whose oscillation frequencies are completely identical due to individual differences of oscillators or environmental conditions such as temperature, humidity, or the like. Therefore, when trying to make the oscillation frequencies of the plurality of high-frequency power sources identical to each other, there is a possibility that mutual interference noise having an indefinite frequency of several Hz to several hundreds of Hz is instead generated.

Furthermore, when the frequency of the generated noise component is largely varied, there may be a case where it cannot be effectively removed even if a filter is used to remove the noise component. If the noise component cannot be removed, there is a possibility that a malfunction may occur in the device. In particular, as described above, if the noise component of the reflected wave component extracted from the directional couplers 513 and 523 cannot be effectively removed, the feedback control of the matchers 272 and 372 may be affected and the plasma generation characteristics may be deteriorated. Furthermore, as the plasma generation characteristics are deteriorated, the amount of generated plasma is remarkably reduced, and the film formation characteristics may be significantly deteriorated.

Therefore, in the present embodiments, the BPFs 514 and 524 are configured such that the oscillation frequencies of the two high-frequency power sources 273 and 373 are intentionally shifted by 2 MHz to specify the frequency of the mutual interference noise, so as to effectively remove the generated mutual interference noise.

The noise component may also be removed by installing the BPFs between the high-frequency power source 273 and the matcher 272 and between the high-frequency power source 373 and the matcher 372. However, when the BPFs are installed in such places, since significantly large high-frequency power passes the BPF, the BPFs may be configured to use circuit elements such as capacitors and coils having a large withstand voltage characteristic and withstand current characteristics, making the BPFs bulky. Therefore, such a BPF arrangement method may cause problems such as a difficulty in securing an installation space and an increase in cost.

On the other hand, in the substrate processing apparatus of the present embodiments, a part of the high-frequency power oscillated by the oscillators 511 and 521 and amplified by the amplifiers 512 and 522 is extracted and a signal attenuated by several tens of dB from the large high-frequency power is then input to the BPFs 514 and 524 by installing the directional couplers 513 and 523.

Therefore, according to the arrangement method of the present embodiments, the BPFs 514 and 524 can be miniaturized to reduce the installation space and cost. In addition, according to the arrangement method of the present embodiments, only the reflected wave signal component can be accurately acquired.

Furthermore, in the present embodiments, there has been described cases where the two high-frequency power sources 273 and 373 have the same configuration, but only one of the two high-frequency power sources 273 and 373 may be configured as illustrated in FIG. 8. Moreover, in the present embodiments, there has been described a configuration in which high-frequency power is supplied to the two plasma generators using the two high-frequency power sources 273 and 373. However, the present disclosure may be similarly applied to a case of using a configuration in which high-frequency power is supplied to three or more plasma generators.

(4) Other Configurations of the High-Frequency Power Sources

Other configurations different from those of the high-frequency power sources 273 and 373 illustrated in FIG. 8 will be described with reference to FIGS. 11 and 12.

Figure 11:
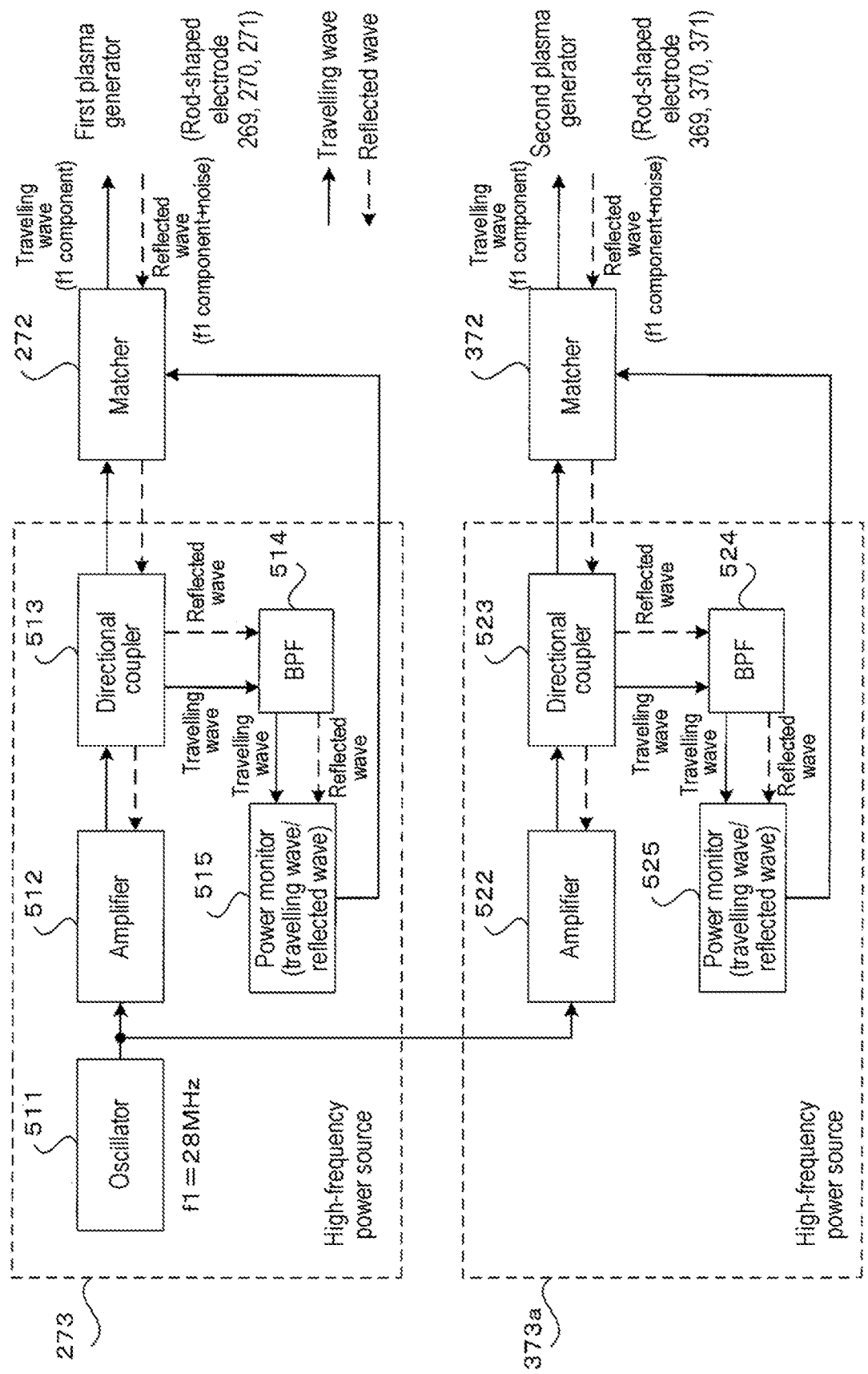
FIG. 11 is a diagram illustrating another configuration example of the high-frequency power sources.

FIG. 11 illustrates a configuration in which the high-frequency power source 373 is replaced by a high-frequency power source 373a. As illustrated in FIG. 11, the high-frequency power source 373a is different in that it is configured so that the oscillator 521 is removed from the high-frequency power source 373 and the oscillation frequency of the oscillator 511 of the high-frequency power source 273 is input.

In the configuration as illustrated in FIG. 11, since the oscillation frequencies of the high-frequency power sources 273 and 373a are identical, which are 28 MHz, the mutual interference noise becomes almost zero, whereby the filter design of the BPFs 514 and 524 is facilitated. However, when matching is desired by changing the frequencies, it is necessary to pay attention so as not to cause a difference in impedances between the plurality of plasma generators.

Furthermore, when the signal from the oscillator 511 of the high-frequency power source 273 is distributed to the amplifier 512 and the amplifier 522 through the signal lines, the distances of the signal lines may be distributed to be identical so that a phase difference does not occur between the outputs of the high-frequency power sources 273 and 373.

Figure 12:
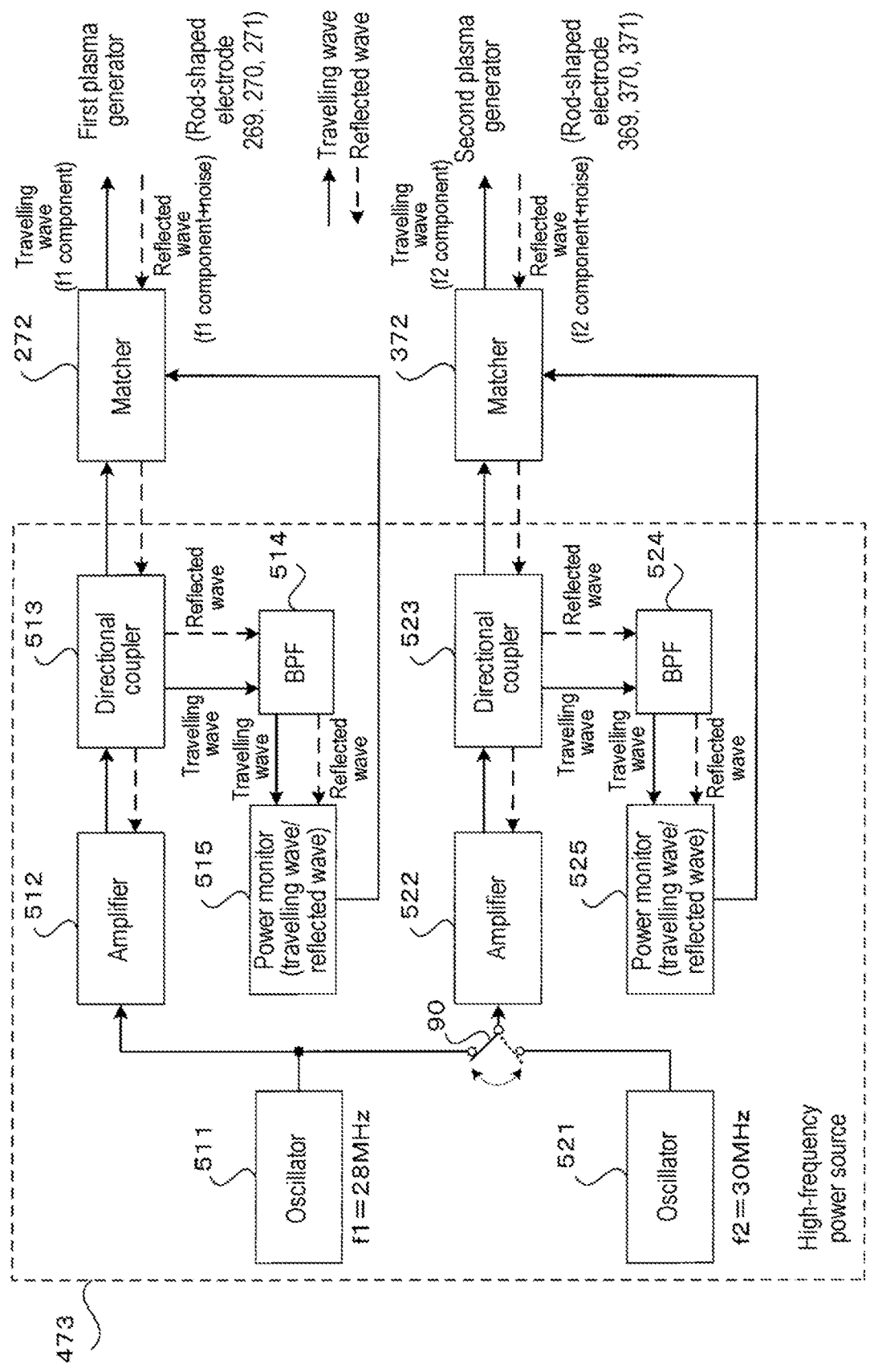
FIG. 12 is a diagram illustrating still another configuration example of the high-frequency power sources.

To this end, as illustrated in FIG. 12, a structure in which the electrical circuits of the two high-frequency power sources are accommodated within one housing and configured as a single high-frequency power source 473 may be adopted, the distance from the oscillator 511 to the amplifier 512 and the distance from the oscillator 511 to the amplifier 522 be substantially identical, and the oscillator 511 and the oscillator 521 be switchable by a switch 90. With this configuration, uniform plasma can be generated by each of the first and the second plasma generators by controlling the high-frequency power source 473 so that substrate processing is performed using each of the oscillators 511 and 521 during normal use, and so that substrate processing is performed using only the oscillator 511 when mutual interference noise cannot be removed due to problems such as aging degradation or the like. On the contrary, only the oscillator 511 may be used at first, and the second oscillator 521 may be then used when there is a difference in plasma generation between the first plasma generator and the second plasma generator.

The embodiments of the present disclosure has been specifically described above. However, the present disclosure is not limited to the aforementioned embodiments but may be differently modified without departing from the spirit of the present disclosure.

For example, in the aforementioned embodiments, there has been described a configuration in which, when two buffer structures are installed, a reaction gas which is different for each buffer structure is plasma-excited and supplied to the wafer. The present disclosure is not limited thereto and the same reaction gas may be plasma-excited and supplied to the wafer.

Furthermore, in the aforementioned embodiments, there has been described an example in which the reaction gas is supplied after the precursor is supplied. The present disclosure is not limited thereto, and the supply order of the precursor and the reaction gas may be reversed. That is, the precursor may be supplied after the reaction gas is supplied. By changing the supply order, it is possible to change the composition ratio and quality of a film as formed.

Moreover, in the aforementioned embodiments, there has been an example in which the SiN film is formed on the wafer 200. The present disclosure is not limited thereto but may be suitably applied to a case where a Si-based oxide film such as a silicon oxide film (SiO film), a silicon oxycarbide film (SiOC film), a silicon oxycarbonitride film (SiOCN film), a silicon oxynitride film (SiON film) or the like is formed on the wafer 200 or a case where a Si-based nitride film such as a silicon carbonitride film (SiCN film), a silicon boronitride film (SiBN film), a silicon borocarbonitride film (SiBCN film), a borocarbonitride film (BCN film) or the like is formed on the wafer 200. In these cases, as the reaction gas, it may be possible to use a C-containing gas such as $C_3H_6$, a N-containing gas such as $NH_3$, or a B-containing gas such as $BCl_3$, as well as the O-containing gas.

Furthermore, the present disclosure may be suitably applied to a case where an oxide film or a nitride film containing a metal element such as titanium (Ti), zirconium (Zr), hafnium (Hf), tantalum (Ta), niobium (Nb), aluminum (Al), molybdenum (Mo), tungsten (W) or the like, i.e., a metal oxide film or a metal nitride film, is formed on the wafer 200. That is, the present disclosure may be suitably applied to a case where a metal-based thin film such as a TiN film, a TiO film, a TiOC film, a TiOCN film, a TiON film or the like is formed on the wafer 200.

In these cases, as the precursor gas, it may be possible to use, for example, tetrakis (dimethylamino) titanium gas, tetrakis (ethylmethylamino) hafnium gas, tetrakis (ethylmethylamino) zirconium gas, trimethylaluminum gas, titanium tetrachloride gas, hafnium tetrachloride gas, or the like. As the reaction gas, it may be possible to use the reaction gas described above.

That is, the present disclosure may be suitably applied to a case where a semi-metal-based film containing a semi-metal element or a metal-based film containing a metal element is formed. The processing procedures and processing conditions of these film-forming processes may be set to the same processing procedures and processing conditions as those of the film-forming processes illustrated in the embodiments and modifications described above. Even in these cases, the same effects as those of the embodiments and modifications described above may be achieved.

Recipes used in the film-forming process may be prepared individually according to the processing contents and may be stored in the memory device 121c via a telecommunication line or the external memory device 123. Moreover, at the start of various processing, the CPU 121a may properly select an appropriate recipe from the plurality of recipes stored in the memory device 121c according to the processing contents. Thus, it is possible for a single substrate processing apparatus to form thin films of different kinds, composition ratios, qualities and thicknesses for general use and with enhanced reproducibility. In addition, it is possible to reduce an operator's burden and to quickly start various processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

According to the present disclosure in some embodiments, it is possible to provide a technique capable of performing stable plasma generation even when plasma generation is performed using a plurality of high-frequency power sources.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A substrate processing apparatus comprising:
a process chamber in which a substrate is processed;
a plurality of plasma generators, including respective buffer structures, configured to generate plasma in which electrodes connected to at least one high-frequency power source configured to supply electric power and electrodes connected to ground are alternately disposed;
at least one matcher configured to match a load impedance of each of the plurality of plasma generators with an output impedance of the at least one high-frequency power source; and
a controller configured to be capable of controlling the at least one matcher and the at least one high-frequency power source such that the load impedance of each of the plurality of plasma generators matches with the output impedance of the at least one high-frequency power source,
wherein the at least one high-frequency power source includes at least one oscillator, a directional coupler, at least one filter, and a power monitor, and
wherein the power monitor is configured to:
measure a reflected wave component after passing through the at least one filter and a traveling wave component extracted by the directional coupler and then passed through the at least one filter; and
feedback-control the at least one matcher to reduce a ratio between the reflected wave component and the traveling wave component measured by the power monitor.

2. The substrate processing apparatus of claim 1, wherein the at least one high-frequency power source includes a plurality of high-frequency power sources configured to supply electric power to the plurality of plasma generators, respectively.

3. The substrate processing apparatus of claim 2, wherein each of the plurality of high-frequency power sources includes:
the oscillator configured to oscillate a high-frequency; and
the directional coupler configured to extract a part of the traveling wave component from the oscillator and a part of the reflected wave component from a corresponding plasma generator of the plurality of plasma generators.

4. The substrate processing apparatus of claim 3, further comprising the at least one filter configured to remove a noise signal included in the reflected wave component extracted by the directional coupler.

5. The substrate processing apparatus of claim 4, wherein the at least one filter is a band-pass filter.

6. The substrate processing apparatus of claim 5, wherein a pass band of the band-pass filter is a frequency range for passing an oscillation frequency of the oscillator.

7. The substrate processing apparatus of claim 4, wherein the at least one filter includes a non-inverting amplifier using a broadband operational amplifier.

8. The substrate processing apparatus of claim 4, wherein the at least one filter is configured to pass the reflected wave component and the traveling wave component extracted by the directional coupler.

9. The substrate processing apparatus of claim 8, wherein the controller is configured to be capable of performing a control of:

measuring the reflected wave component and the traveling wave component extracted by the directional coupler; and reducing a phase difference between the reflected wave component and the traveling wave component.

10. The substrate processing apparatus of claim 4, wherein the plurality of high-frequency power sources includes a plurality of oscillators, respectively, and wherein frequencies oscillated from the plurality of oscillators are different from each other.

11. The substrate processing apparatus of claim 10, wherein the at least one filter includes a plurality of filters that is installed at the plurality of high-frequency power sources, respectively.

12. The substrate processing apparatus of claim 11, wherein pass bands of the plurality of filters are different from each other.

13. The substrate processing apparatus of claim 12, wherein the at least one filter has a frequency characteristic capable of removing a noise signal caused by difference between different frequencies oscillated from different oscillators of the plurality of oscillators.

14. The substrate processing apparatus of claim 4, wherein each of the plurality of high-frequency power sources further includes an amplifier configured to amplify the high-frequency oscillated by the oscillator, and wherein the directional coupler is configured to extract a part of a high-frequency electric power, which is oscillated by the oscillator and amplified by the amplifier, and input a signal attenuated from the amplified high-frequency electric power to the at least one filter.

15. The substrate processing apparatus of claim 1, wherein when a high-frequency electric power is applied to the electrodes connected to the at least one high-frequency power source, each of the plurality of plasma generators plasma-excites gas and supplies the plasma-excited gas to the substrate.

16. A plasma generation device comprising:

a plurality of plasma generators including respective buffer structures configured to generate plasma in which electrodes connected to at least one high- frequency power source configured to supply electric power and electrodes connected to ground are alternately disposed;

at least one matcher configured to match a load impedance of each of the plurality of plasma generators with an output impedance of the at least one high-frequency power source; and a controller configured to be capable of controlling the at least one matcher and the at least one high-frequency power source such that the load impedance of each of the plurality of plasma generators matches with the output impedance of the at least one high-frequency power source, wherein the at least one high-frequency power source includes at least one oscillator, a directional coupler, at least one filter, and a power monitor, and wherein the power monitor is configured to:

measure a reflected wave component after passing through the filter and a traveling wave component extracted by the directional coupler and then passed through the filter; and feedback-control the at least one matcher to reduce a ratio between the reflected wave component and the traveling wave component measured by the power monitor.

* * * * *